United States Patent
Johnson (10) Patent No.: US 9,779,806 B2
(45) Date of Patent: *Oct. 3, 2017

(54) RESISTIVE MEMORY SENSING METHODS AND DEVICES

(71) Applicant: Micron Technology, Inc., Boise, ID (US)

(72) Inventor: Adam D. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 281 days.

This patent is subject to a terminal disclaimer.

(21) Appl. No.: 13/938,052

(22) Filed: Jul. 9, 2013

(65) Prior Publication Data

US 2013/0294148 A1  Nov. 7, 2013

Related U.S. Application Data

(62) Division of application No. 13/035,193, filed on Feb. 25, 2011, now Pat. No. 8,482,955.

(51) Int. Cl.
*G11C 11/00* (2006.01)
*G11C 13/00* (2006.01)
*G11C 11/56* (2006.01)

(52) U.S. Cl.
CPC ............ *G11C 13/004* (2013.01); *G11C 11/56* (2013.01); *G11C 13/0007* (2013.01); *G11C 13/0061* (2013.01); *G11C 2211/5631* (2013.01)

(58) Field of Classification Search
CPC ... G11C 13/004; G11C 11/56; G11C 13/0061; G11C 13/0007; G11C 2211/5631
(Continued)

(56) References Cited

U.S. PATENT DOCUMENTS

| | | |
|---|---|---|
| 6,501,697 B1 | 12/2002 | Perner et al. |
| 6,831,854 B2 | 12/2004 | Rinerson et al. |

(Continued)

FOREIGN PATENT DOCUMENTS

| | | |
|---|---|---|
| CN | 101194322 A | 6/2008 |
| CN | 101512663 A | 8/2009 |

(Continued)

OTHER PUBLICATIONS

Notice of Rejection Ground from related Japanese patent application No. 2013-555561, dated Jul. 8, 2014, 7 pp.

(Continued)

*Primary Examiner* — Tha-O H Bui
(74) *Attorney, Agent, or Firm* — Brooks, Cameron & Huebsch, PLLC (57) ABSTRACT

Resistive memory sensing methods and devices are described. One such method includes performing a voltage based multiple pass sensing operation on a group of cells coupled to a selected conductive line of an array of resistive memory cells. The voltage based multiple pass sensing operation can include providing an indication of those cells of the group that conduct at least a threshold amount of current responsive to one of a number of different sense voltages successively applied to the selected conductive line during each of a corresponding number of the multiple passes, and for each successive pass of the multiple passes, disabling data lines corresponding to those cells determined to have conducted the threshold amount of current in association with a previous one of the multiple passes.

18 Claims, 8 Drawing Sheets

(58) Field of Classification Search
USPC .................................................. 365/148, 163
See application file for complete search history.

(56) References Cited

U.S. PATENT DOCUMENTS

| | | |
|---|---|---|
| 6,870,755 B2 | 3/2005 | Rinerson et al. |
| 6,946,702 B2 | 9/2005 | Jang |
| 7,027,342 B2 | 4/2006 | Inoue |
| 7,196,928 B2 | 3/2007 | Chen |
| 7,236,389 B2 | 6/2007 | Hsu |
| 7,539,040 B2 | 5/2009 | Tamai et al. |
| 7,542,337 B2 | 6/2009 | Scheuerlein et al. |
| 7,639,522 B2 | 12/2009 | Cho et al. |
| 7,787,282 B2 | 8/2010 | Ramani et al. |
| 7,885,101 B2 | 2/2011 | Bedeschi et al. |
| 8,482,955 B2 * | 7/2013 | Johnson .................. G11C 11/56 365/148 |
| 2006/0023497 A1 * | 2/2006 | Kawazoe ........... G11C 13/0007 365/158 |
| 2006/0203542 A1 * | 9/2006 | Kurotsuchi ........ G11C 13/0004 365/163 |
| 2008/0025072 A1 | 1/2008 | Tamai et al. |
| 2008/0112221 A1 | 5/2008 | Park et al. |
| 2008/0123389 A1 * | 5/2008 | Cho et al. ..................... 365/148 |
| 2009/0016100 A1 | 1/2009 | Jeong |
| 2009/0219749 A1 | 9/2009 | Lamorey et al. |
| 2009/0225594 A1 | 9/2009 | Choi et al. |
| 2009/0251952 A1 | 10/2009 | Ma et al. |
| 2010/0246250 A1 | 9/2010 | Chen et al. |
| 2010/0271875 A1 | 10/2010 | Jung et al. |
| 2010/0315866 A1 * | 12/2010 | Park .................... G11C 11/5678 365/163 |
| 2013/0010523 A1 | 1/2013 | Yan et al. |

FOREIGN PATENT DOCUMENTS

| | | |
|---|---|---|
| CN | 101908374 A | 12/2010 |
| JP | 2008034033 A | 2/2008 |
| JP | 2009545836 A | 12/2009 |
| JP | 2010157306 A | 7/2010 |
| KR | 20100080348 A | 7/2010 |
| WO | 2008016946 A2 | 2/2008 |
| WO | 2011004448 A1 | 1/2011 |

OTHER PUBLICATIONS

Office Action from related Japanese Patent Application No. 2013555561, dated Mar. 11, 2014, 9 pp.
Notice of Rejection from related Korean patent application No. 10-2013-7024398, dated Dec. 9, 2014, 12 pp.
International Search Report and Written Opinion for related PCT Application No. PCT/US2012/026329, mailed Dec. 12, 2012, (8 pgs.).
Notice of Rejection from related Japanese patent application No. 2013-555561, dated Nov. 18, 2014, 5 pp.
First Office Action from related Chinese patent application No. 201280017182.2 dated Feb. 4, 2015, 45 pp.
Second Office Action from related Chinese patent application No. 201280017182.2, dated Sep. 24, 2015, 25 pp.
Supplementary Search Report from related European patent application No. 12749593.5, dated Feb. 22, 2017, 8 pp.

* cited by examiner

RESISTIVE MEMORY SENSING METHODS AND DEVICES

PRIORITY APPLICATION INFORMATION

This application is a Divisional of U.S. application Ser. No. 13/035,193, filed Feb. 25, 2011, the specification of which is incorporated herein by reference.

TECHNICAL FIELD

The present disclosure relates generally to the field of semiconductor memory. More particularly, in one or more embodiments the present disclosure relates to a resistive memory sensing methods and devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), resistive random access memory (RRAM), magnetoresistive random access memory (MRAM; also referred to as magnetic random access memory), conductive-bridging random access memory (CBRAM), among others.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player (e.g., MP3 player), a movie player, and other electronic devices, among others. Program code and system data, such as a basic input/output system (BIOS), are typically stored in non-volatile memory devices.

Non-volatile resistive memory such as RRAM, PCRAM, MRAM, and CBRAM, for example, include memory elements having a variable resistance and which may exhibit linear or nonlinear I-V characteristics. As such, resistive memory cells can be programmed to store data corresponding to a desired state by varying the resistance of the resistive memory element. As an example, data may be written to a selected memory cell in a resistive memory by applying a predetermined current to the resistive memory element. Resistance states may be programmed in accordance with a linear distribution, or a non-linear distribution. As an example, a single level cell (SLC) may represent one of two data states (e.g., logic 1 or 0), which can depend on whether the cell is programmed to a resistance above or below a particular level. Various resistive memory cells can be programmed to multiple different resistance levels corresponding to multiple data states. Such cells may be referred to as multi state cells, multi digit cells, and/or multi level cells (MLCs) and can represent multiple binary digits (e.g., 10, 01, 00, 11, 111, 101, 100, 1010, 1111, 0101, 0001, etc.)

The data state of resistive memory cells coupled to a selected word line can be determined by sensing current on the bit lines corresponding to the respective cells. However, previous approaches to sensing (e.g., reading) the data state of resistive memory cells have various drawbacks.

DETAILED DESCRIPTION

The present disclosure includes resistive memory sensing methods and devices. One such method includes performing a voltage based multiple pass sensing operation on a group of cells coupled to a selected conductive line of an array of resistive memory cells. The voltage based multiple pass sensing operation can include providing an indication of those cells of the group that conduct at least a threshold amount of current responsive to one of a number of different sense voltages successively applied to the selected conductive line during each of a corresponding number of the multiple passes, and for each successive pass of the multiple passes, disabling data lines corresponding to those cells determined to have conducted the threshold amount of current in association with a previous one of the multiple passes.

Embodiments of the present disclosure can provide benefits such as reducing the current on a selected conductive line (e.g., word line) during sensing (e.g., read) operations performed on resistive memory cells coupled to the selected conductive line, as compared to previous approaches, among other benefits. Reducing the current on a selected word line in association with a read operation can reduce the voltage drop on the selected word line, which can result in improved sensing accuracy and/or can improve (e.g., increase) the number of distinguishable resistance states within a sensing window, for instance. Embodiments can also reduce the current draw of a data line (e.g., bit line) supply in association with sensing operations, for example.

The figures herein follow a numbering convention in which the first digit or digits correspond to the drawing figure number and the remaining digits identify an element or component in the drawing. Similar elements or components between different figures may be identified by the use of similar digits. For example, 115 may reference element "15" in FIG. 1, and a similar element may be referenced as 315 in FIG. 3A, etc.

Figure 1:
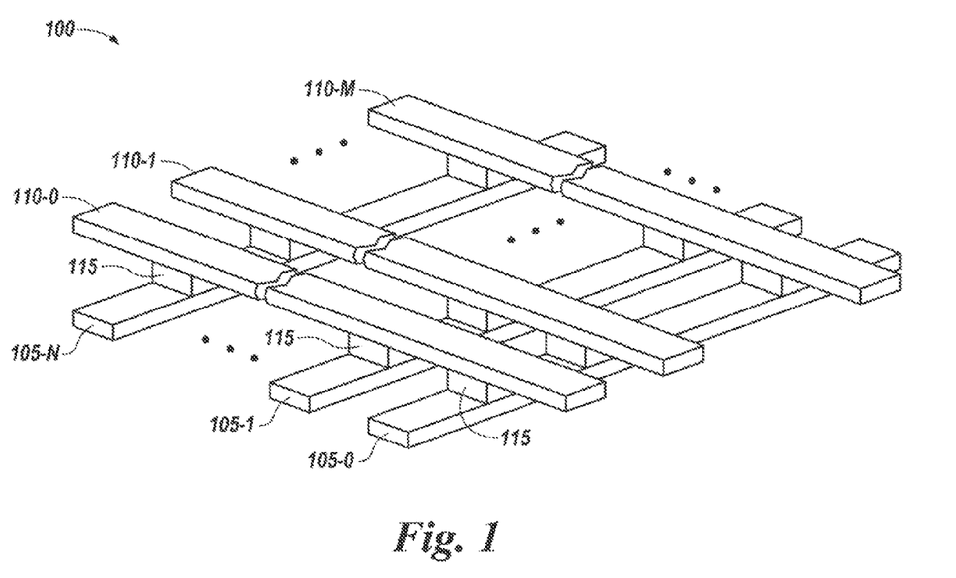
FIG. 1 is a block diagram of a portion of an array of resistive memory cells in accordance with one or more embodiments of the present disclosure.

FIG. 1 is a block diagram of a portion of an array 100 of resistive memory cells in accordance with one or more embodiments of the present disclosure. In the example illustrated in FIG. 1, the array 100 is a cross point array 100 including a first number of conductive lines 105-0, 105-1, . . . , 105-N (e.g., access lines, which may be referred to herein as word lines) and a second number of conductive lines 110-0, 110-1, . . . , 110-M (e.g.,data lines, which may be referred to herein as bit lines). As illustrated, the word lines 105-0, 105-1, . . . , 105-N are substantially parallel to each other and are substantially orthogonal to the bit lines 110-0, 110-1, . . . , 110-M, which are substantially parallel to each other; however, embodiments are not so limited.

The resistive memory cells of array 100 include the resistive memory elements 115 located at the intersections of the word lines 105-0, 105-1, . . . , 105-N and bit lines 110-0, 110-1, . . . , 110-M. As such, the resistive memory elements 115 may be themselves referred to herein as resistive memory cells 115. In one or more embodiments, the resistive memory cells can be two terminal devices. In such embodiments, a particular word line 105-0, 105-1, . . . , 105-N and bit line 110-0, 110-1, . . . , 110-M can serve as a top and bottom electrode for the cell.

The resistive memory elements 115 can include one or more resistance variable materials (e.g., a material programmable to multiple different resistance levels, which can represent multiple different data states) and may also include other materials and/or structures in a "stack," for instance. As an example, the resistive memory elements 115 may include a resistance variable material and a non-ohmic structure such as a metal-insulator-metal (MIM) structure. Various resistive memory cells can include a select device (e.g., an access device), such as a transistor or diode, coupled to a resistance variable element with the select device having a symmetric or asymmetric I-V characteristic. In some instances, a select device can also exhibit a memory effect (e.g., a state retention characteristic); however, the primary function of a select device is selecting one or more particular variable resistive materials, which have a primary memory effect.

The resistive variable material of the memory elements 115 can be a crystalline or polycrystalline structure, for instance. As an example, the resistance variable material can be a transition metal oxide material or a perovskite including two or more metals (e.g., transition metals, alkaline earth metals, and/or rare earth metals). Embodiments are not limited to a particular resistive variable material or materials associated with memory elements 115. For instance, various materials employing trapped charges to modify or alter conductivity can be used in the memory elements 115. In one or more embodiments, the resistive variable material can be a chalcogenide formed of various doped or undoped materials. Other examples of resistive variable materials that can be used to form memory elements 115 include binary metal oxide materials, colossal magnetoresistive materials, and/or various polymer based resistive variable materials, among others.

The particular structure of the resistive memory elements 115 can affect the uppermost resistance level and the lowermost resistance level associated with the memory cells. The difference between the uppermost and lowermost resistance level of the memory cell (e.g., the resistance window) can affect the number of distinguishable resistance levels and corresponding number of data states of the cell (e.g., states to which the cell can be programmed), for instance. As an example, the uppermost resistance level associated with the variable resistance material of a memory element 115 may be about 10 to 100 Megaohms (Mohms) and the lowermost resistance level may be about 100 Kiloohms (Kohms) to 1 Mohm. Embodiments are not limited to a particular uppermost and/or lowermost resistance level.

In operation, the memory cells of array 100 can be programmed by applying a voltage (e.g., a write voltage) across the resistive elements 115 via selected word lines 105-0, 105-1, . . . , 105-N and bit lines 110-0, 110-1, . . . , 110-M. The width and/or magnitude of the voltage pulses across the resistive elements 115 can be adjusted (e.g., varied) in order to program the memory cells 115 to a number of different resistance levels corresponding to particular data states.

A sensing (e.g., read) operation can be used to determine the resistance level of a resistive element 115 by sensing current, for example, on a bit line 110-0, 110-1, . . . 110-M corresponding to the respective resistive element 115 responsive to a particular voltage applied to the selected word line 105-0, 105-1, . . . , 105-N to which the respective resistive element 115 is coupled. In one or more embodiments, a group of resistive memory cells 115 coupled to a selected word line 105-0, 105-1, . . . , 105-N can be sensed simultaneously. For instance, a number of cells 115 that correspond to a page of data on a selected word line may be sensed together in a sensing operation. In some embodiments, one or more groups of the number of cells associated with a page of data may be sensed individually as a group. In some previous approaches, and as described further below in connection with FIGS. 2A and 2B, the data state of each cell in a group of cells can be determined by applying a fixed (e.g., constant) voltage to the selected word line corresponding to the group and sensing the different current amounts on each of the respective bit lines corresponding to the group of cells. The different current amounts can each correspond to a particular distribution (e.g., "bin") of current corresponding to a particular data state of a number of data states to which the cells can be programmed. In this manner, the data states corresponding to a group of cells 115 coupled to a selected word line 105-0, 105-1, . . . , 105-N can be determined substantially simultaneously.

However, simultaneously reading a group of cells 115 using a fixed voltage applied to the selected word line 105-0, 105-1, . . . , 105-N and simultaneously sensing the corresponding bit line 110-0, 110-1, . . . , 110-M currents can result in a relatively large voltage drop across the selected word line 105-0, 105-1, . . . , 105-N. As described further below, the amount of the voltage drop across the selected word line 105-0, 105-1, . . . , 105-N depends on the data pattern of the cells being read. For instance, according to Ohm's law, the voltage drop across the selected word line would be equal to the cumulative current down each of the corresponding bit lines multiplied by the resistance of the selected word line. A relatively large voltage drop across the selected word line and/or a variable voltage drop across the word line can have drawbacks such as altering (e.g., reducing) the amount of sensed current on the bit lines, which can affect the accuracy of the read operation and overall data integrity, among other drawbacks.

Figure 2A:
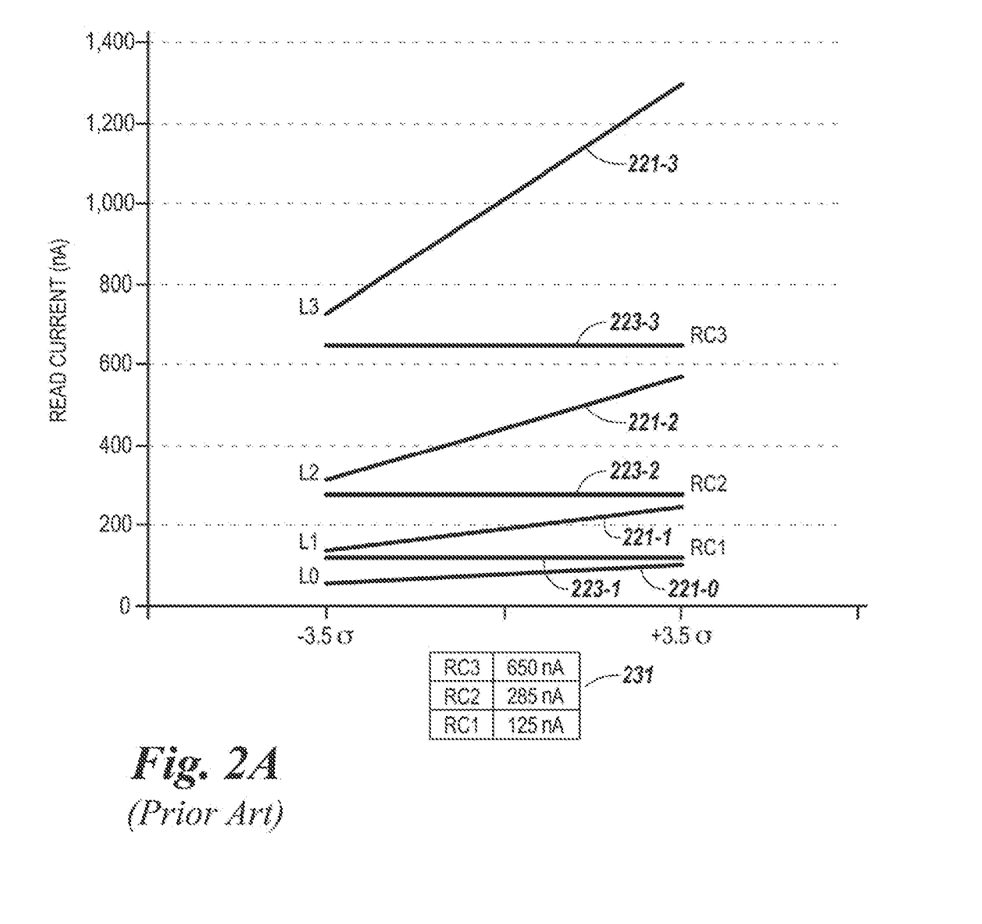
FIG. 2A illustrates a graph associated with a current based resistive memory sensing method in accordance with the prior art.
Figure 2B:
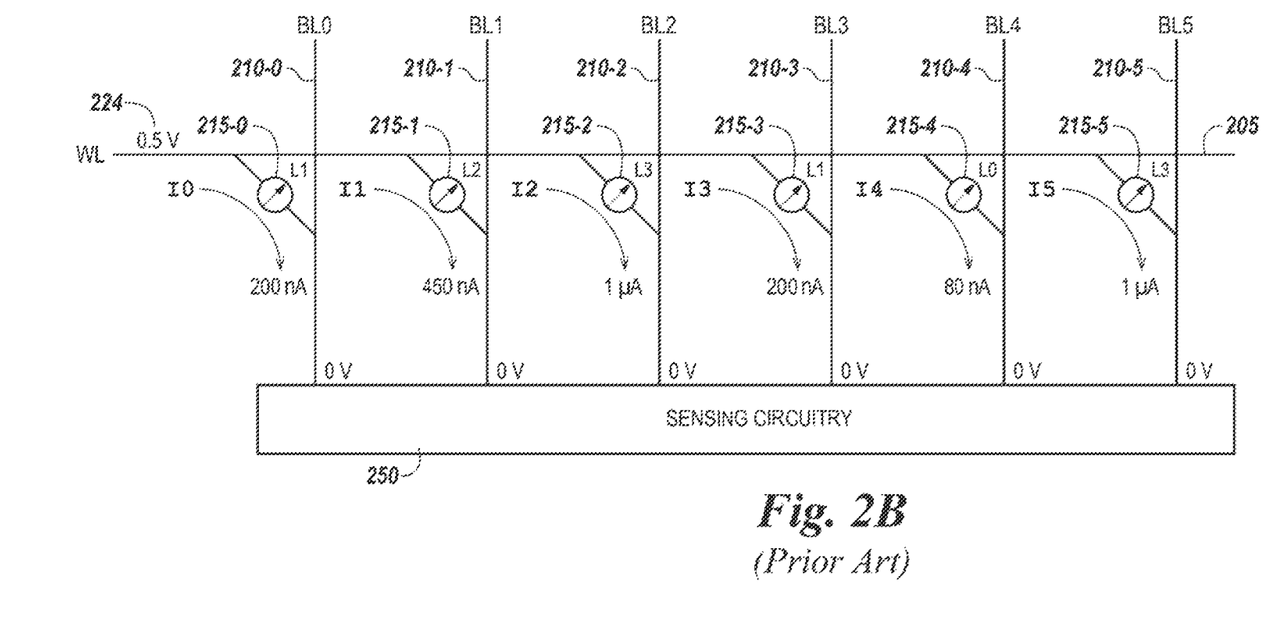
FIG. 2B illustrates a schematic diagram of a portion of a resistive memory array sensed in accordance with the prior art current based resistive memory sensing method of FIG. 2A.

FIG. 2A illustrates a graph associated with a current based resistive memory sensing method in accordance with the prior art. FIG. 2B illustrates a schematic diagram of a portion of a resistive memory array sensed in accordance with the prior art sensing method of FIG. 2A.

The graph shown in FIG. 2A illustrates a number of resistance states 221-0 (L0), 221-1 (L1), 221-2 (L2), and 221-3 (L3) to which a number of resistive memory cells, such as those described in connection with FIG. 1, can be programmed. As such, the resistance states can be referred to as data states. Each of the resistance states L0, L1, L2, and L3 represent cells programmed to a resistance level within a distribution (e.g., range) of resistances corresponding to the respective states. Each of the resistance states L0, L1, L2, and L3 represents a data state associated with the memory cells and, as such, each cell can store multiple digits (e.g., multiple bits of data). For instance, each resistance state L0, L1, L2, and L3 can be assigned a particular logical data value, such as binary 00, 01, 10, 11. Embodiments are not limited to a particular logical data assignment for the number of resistance states.

The number of resistance states L0, L1, L2, and L3 associated with resistive memory cells can depend on various factors such as the programmable resistance window associated with the cells (e.g. the difference between an uppermost and lowermost programmable resistance level of the cells), among other factors. A larger resistance window can allow for more resistance states and/or can increase the distance between adjacent resistance states, which can improve the accuracy associated with distinguishing between states during read operations, for instance. As an example, the uppermost and lowermost resistance states (e.g., L0 and L3) can be separated by a factor of 100 or a factor of 1000. The intermediate states (e.g., L1 and L2 in this example) can evenly subdivide the resistance range between the uppermost and lowermost resistive state (e.g., on a logarithmic scale), for instance.

The graph shown in FIG. 2A also illustrates a number of read currents 223-1 (RC1), 223-2 (RC2), and 223-3 (RC3) that are used by sensing circuitry (e.g., sensing circuitry 250) to determine the data state 221-0 (L0), 221-1 (L1), 221-2 (L2), and 221-3 (L3) of a cell (e.g., to distinguish between the different states). As illustrated in table 231, in this example, read current 223-1 is 125 nanoamps (nA), read current 223-2 is 285 nA, and read current 223-3 is 650 nA. As described further below in connection with FIG. 2B, a prior art read operation can include applying a fixed read voltage to a selected word line coupled to a group of cells and determining the states of each of the cells of group based on the amount of current sensed on the bit lines corresponding to the respective cells. In this example, cells coupled to bit lines conducting a current less than RC1 (e.g., less than 125 nA) would be determined to be in state L0, cells coupled to bit lines conducting a current between RC1 and RC2 (e.g., between 125 nA and 285 nA) would be determined to be in state L1, cells coupled to bit lines conducting a current between RC2 and RC3 (e.g., between 285 nA and 650 nA) would be determined to be in state L2, and cells coupled to bit lines conducting a current greater than RC3 (e.g., greater than 650 nA) would be determined to be in state L3.

FIG. 2B illustrates a schematic diagram of a portion of a resistive memory array such as array 100 sensed in accordance with the prior art sensing method described in connection with FIG. 2A. FIG. 2B illustrates a number of resistive memory cells 215-0, 215-1, 215-2, 215-3, 215-4, and 215-5 each coupled to one of a respective number of bit lines 210-0 (BL0), 210-1 (BL1), 210-2 (BL2), 210-3 (BL3), 210-4 (BL4), and 210-5 (BL5) and to a selected word line (WL) 205. Although not illustrated in FIG. 2B, the array includes a number of word lines in addition to the selected word line 205. The additional word lines can be referred to as unselected word lines as they do not participate in the sensing operation. In the example illustrated in FIG. 2B, cell 215-0 has a resistance level corresponding to state L1, cell 215-1 has a resistance level corresponding to state L2, cell 215-2 has a resistance level corresponding to state L3, cell 215-3 has a resistance level corresponding to state L1, cell 215-4 has a resistance level corresponding to state L0, and cell 215-5 has a resistance level corresponding to state L3 (e.g., states 221-0 (L0) through 221-3 (L3) shown in FIG. 2A).

FIG. 2B illustrates a method of simultaneously sensing (e.g., reading) the number of cells 215-0, 215-1, 215-2, 215-3, 215-4, and 215-5 coupled to the selected word line 205. In the sensing operation illustrated in FIG. 2B, a fixed read voltage 224 is applied to the selected word line 205. In this example, the fixed read voltage 224 is 0.5V and a reference (e.g., ground) voltage of 0V is applied to the bit lines 210-0 through 210-5 such that a potential difference (e.g., 0.5V) is created across each of the memory cells 215-0 through 215-5. As described above in connection with FIG. 2A, the cells 215-0 through 215-5 will conduct a current amount indicative of the programmed resistance state of the cell. Sensing circuitry 250 can be used to determine the state of the cells 215-0 through 215-5 based on sensed particular current amounts conducted by the cells 215-0 through 215-5 responsive to the applied fixed sense voltage 224.

In the example illustrated in FIG. 2B, sensing circuitry 250 senses a current I0 of 200 nA conducted by cell 215-0, a current I1 of 450 nA conducted by cell 215-1, a current I2 of 1 microamp (μA) conducted by cell 215-2, a current I3 of 200 nA conducted by cell 215-3, a current I4 of 80 nA conducted by cell 215-4, and a current I5 of 1 μA conducted by cell 215-5, responsive to the 0.5V sense voltage 224 applied to the selected word line 205. Since the 80 nA sensed current I4 is less than the 125 nA read current 223-1 (RC1) shown in FIG. 2A, the sensing circuitry 250 determines cell 215-4 to be in state L0. Similarly, since the 200 nA sensed current I0 and I3 is between the 125 nA read current 223-1 (RC1) and the 285 nA read current 223-2 (RC2), cells 215-0 and 215-3 are determined to be in state L1. Cell 215-1 is determined to be in state L2 since the 450 nA sensed current I1 is between the 285 nA read current 223-2 (RC2) and the 650 nA read current 223-3 (RC3). Also, cell 215-2 is determined to be in state L3 since the 1 μA sensed current I2 is greater than the 650 nA read current 223-3 (RC3).

In this manner, the states of the group of cells 215-0 through 215-5 are simultaneously determined based on the different currents conducted by the respective cells 215-0 through 215-5 responsive to the fixed sense voltage 224 applied to the selected word line 205. However, simultaneously sensing the group of cells 215-0 through 215-5 in accordance with the current based approach described in connection with FIGS. 2A and 2B can cause a significant voltage drop across the selected word line 205. As noted above, the voltage drop across the word line 205 depends on the data pattern associated with the cells 215-0 through 215-5 and is equal to the internal resistance of the word line 205 multiplied by the cumulative current sensed on the bit lines 210-0 through 210-5.

For instance, if each of the cells 215-0 through 215-5 were programmed to state L3, then the cumulative current would be about 6 μA and if each of the cells were programmed to state L0, then the cumulative current would be about 480 nA. Although only six bit lines are shown in FIG. 2B, a resistive memory array can include various number of bit lines (e.g., 64, 512, 1024, 8192, etc.). As such, the cumulative current down the selected word line 205 during a sensing operation such as that described in connection with FIGS. 2A and 2B can potentially be several milliamps. Accordingly, the corresponding voltage drop across the word line 205 can become large, which can reduce the accuracy of the sensing operation and/or can result in a reduced number of resistance states associated with the memory cells, among other drawbacks.

Figure 3A:
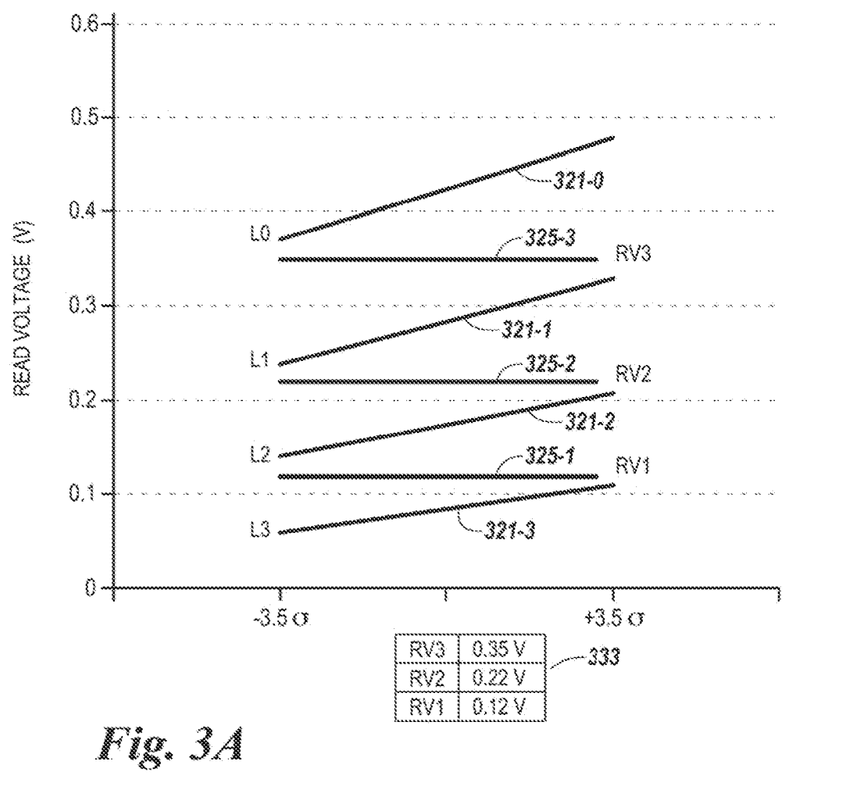
FIG. 3A illustrates a graph associated with a voltage based resistive memory sensing method in accordance with one or more embodiments of the present disclosure.

FIG. 3A illustrates a graph associated with a voltage based resistive memory sensing method in accordance with one or more embodiments of the present disclosure. The graph shown in FIG. 3A illustrates a number of resistance states 321-0 (L0), 321-1 (L1), 321-2 (L2), and 321-3 (L3). Similar to states 221-0 to 221-3 shown in FIG. 2A, states L0, L1, L2, and L3 represent cells programmed to a resistance level within a distribution (e.g., range) of resistances corresponding to the respective states. As such, each cell can store multiple bits of data.

The graph shown in FIG. 3A also illustrates a number of sense (e.g., read) voltages 325-1 (RV1), 325-2 (RV2), and 325-3 (RV3) that are used in conjunction with one or more sensing operations described herein. As illustrated in table 333, in this example, read voltage 325-1 is 0.12V, read voltage 325-2 is 0.22V, and read voltage 325-3 is 0.35V. The particular read voltages RV1, RV2, and RV3 are selected to distinguish between the resistance states L0, L1, L2, and L3.

As described further below in connection with FIGS. 3B-3D, according to one or more embodiments, a voltage based multiple pass sensing operation can include successively applying a number of different sense voltages (e.g., RV1, RV2, and RV3) to a selected word line coupled to a group of resistive memory cells and, for each of the multiple sensing passes, providing an indication of those cells of the group that conduct at least a threshold amount of current responsive to the respective one of the sense voltages applied to the selected word line. In one or more embodiments, each successive pass of the multiple sensing passes can include disabling bit lines corresponding to those cells determined to have conducted at least the threshold amount of current in association with a previous one of the multiple sensing passes. Disabling bit lines can include applying a disabling voltage to those bit lines corresponding to cells determined to have conducted at least the threshold amount of current in association with a previous one of the multiple sensing passes. Embodiments are not so limited. For instance, in one or more embodiments, disabling a bit line can include leaving the bit line floating. In such instances, the bit lines can become disabled (e.g., non-conducting) as the bit line charges to the word line voltage, for example.

In one or more embodiments, the threshold amount of current can be fixed over the number of multiple sensing passes; however, embodiments are not so limited. For instance, the threshold amount of current can vary over the multiple sensing passes (e.g., a different threshold amount of current can be used for one or more of the multiple sensing passes).

Figure 3B:
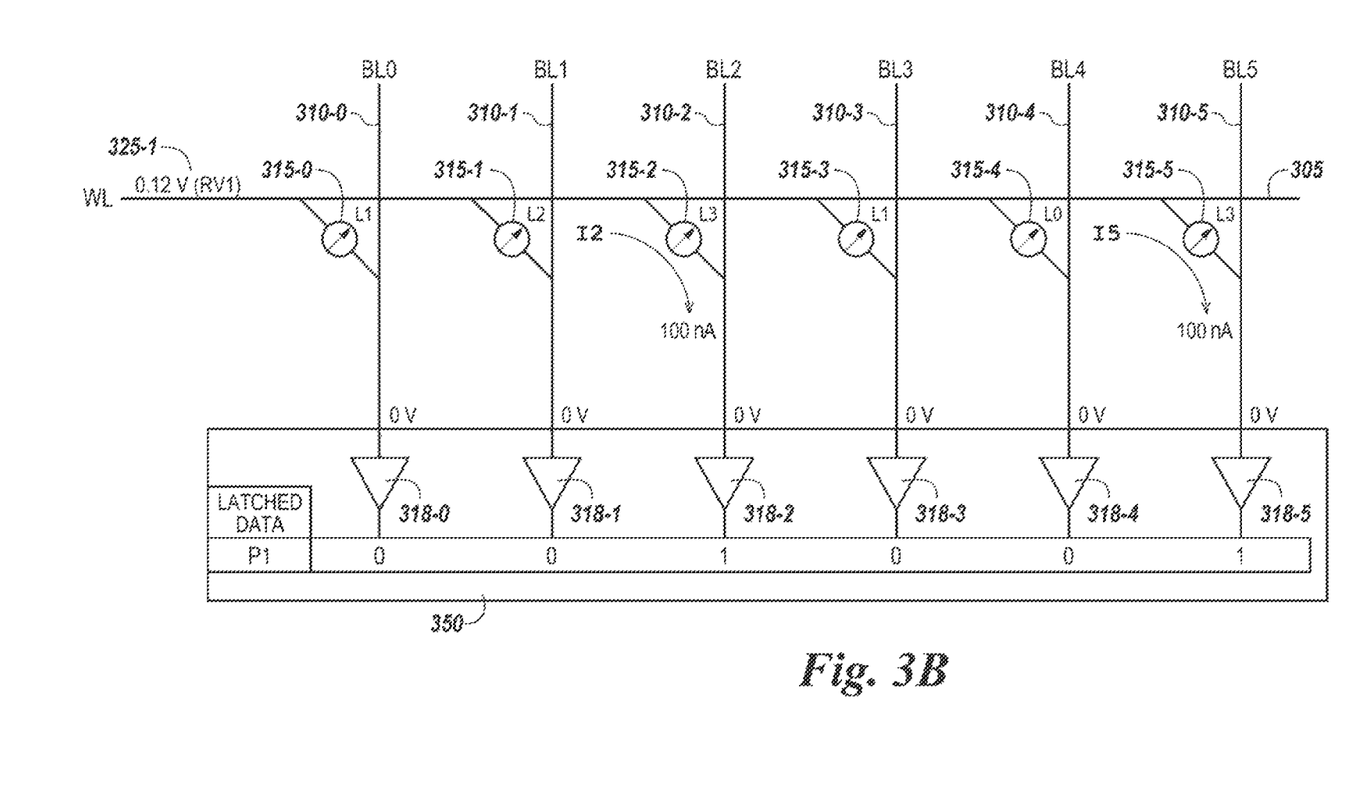
FIGS. 3B-3D illustrate schematic diagrams of a portion of a resistive memory array sensed in accordance with the voltage based resistive memory sensing method associated with FIG. 3A.
Figure 3C:
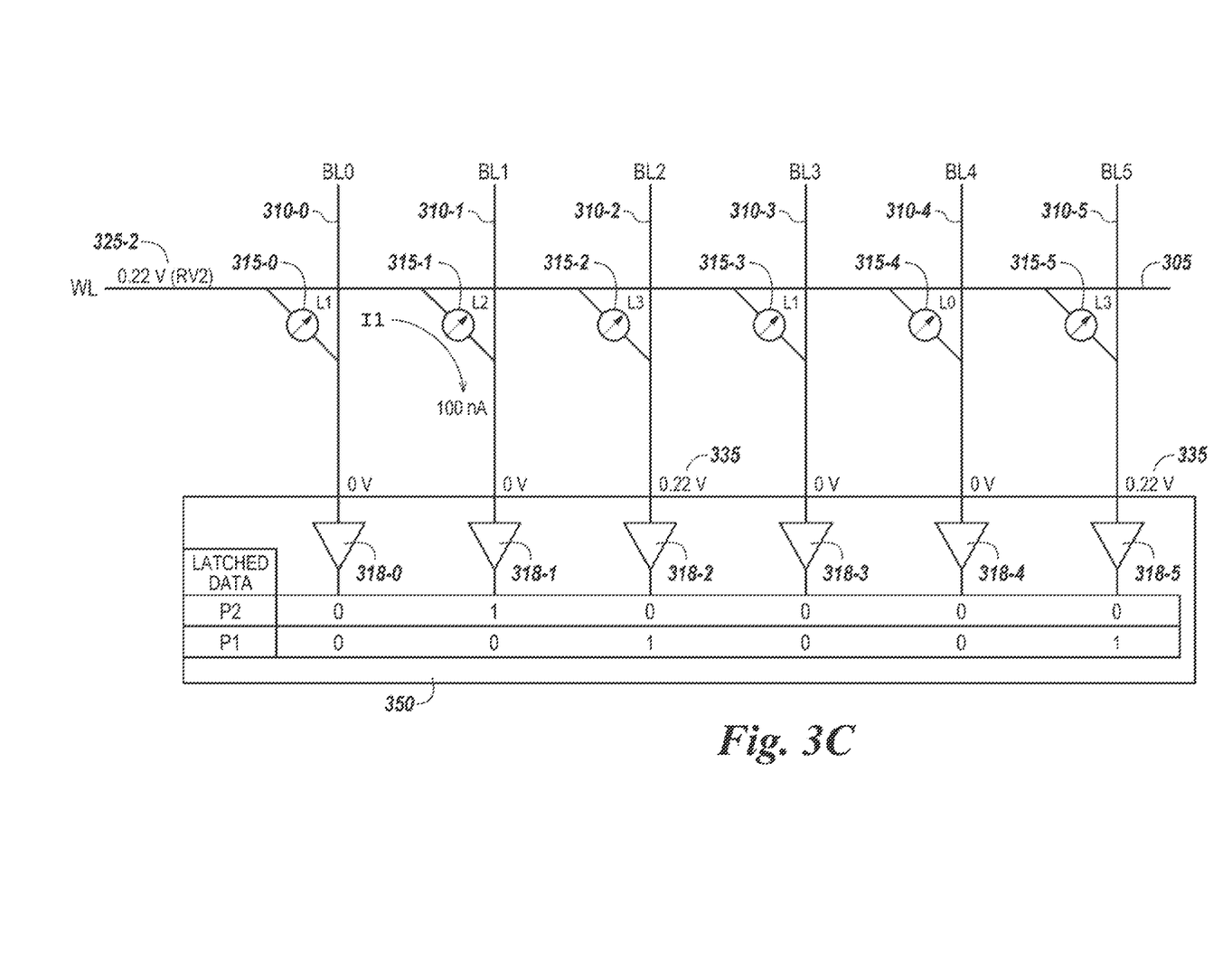
Figure 3D:
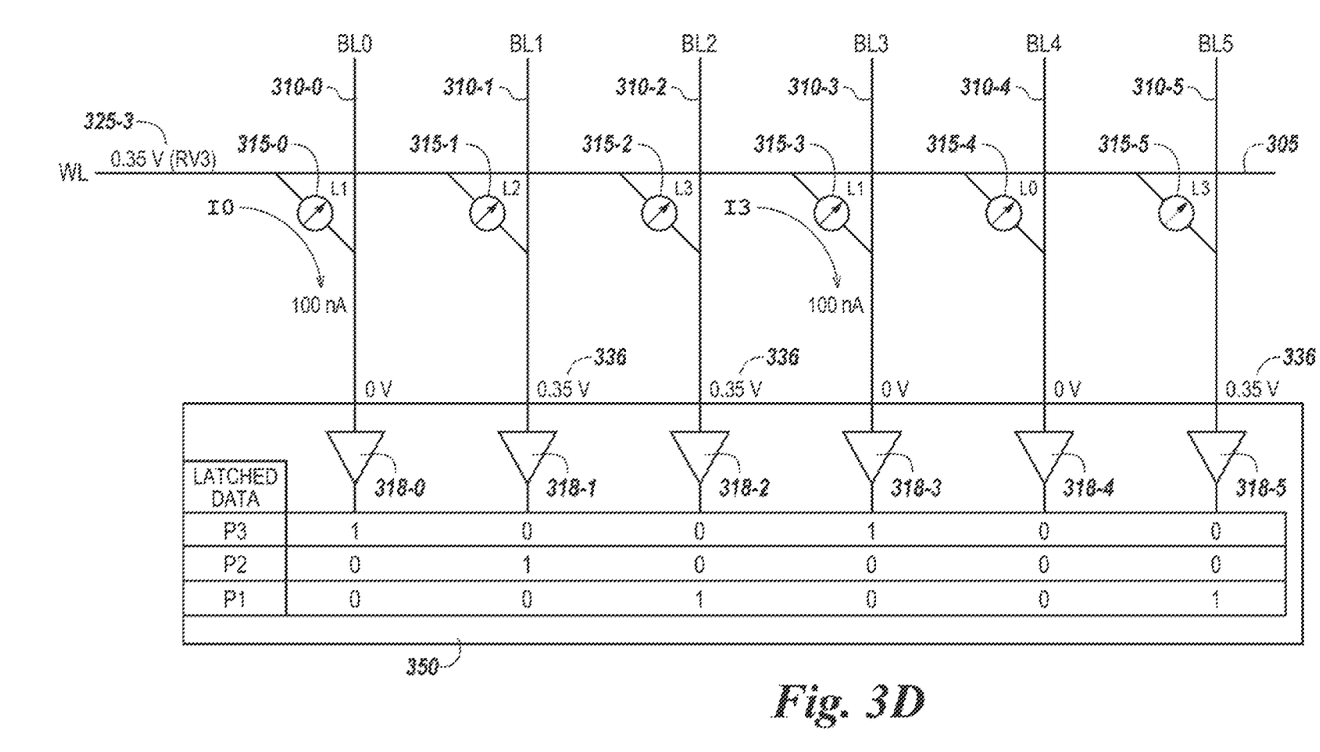

FIGS. 3B-3D illustrate schematic diagrams of a portion of a resistive memory array such as array 100 sensed in accordance with the voltage based resistive memory sensing method associated with FIG. 3A. FIGS. 3B-3D include a number of resistive memory cells 315-0, 315-1, 315-2, 315-3, 315-4, and 315-5 each coupled to one of a respective number of bit lines 310-0 (BL0), 310-1 (BL1), 310-2 (BL2), 310-3 (BL3), 310-4 (BL4), and 310-5 (BL5) and to a selected word line (WL) 305. Although not illustrated in FIGS. 3B-3D, the array can include a number of word lines in addition to the selected word line 305. In the example illustrated in FIGS. 3B-3D, cell 315-0 has a resistance level corresponding to state L1, cell 315-1 has a resistance level corresponding to state L2, cell 315-2 has a resistance level corresponding to state L3, cell 315-3 has a resistance level corresponding to state L1, cell 315-4 has a resistance level corresponding to state L0, and cell 315-5 has a resistance level corresponding to state L3 (e.g., states 321-0 (L0) through 321-3 (L3) shown in FIG. 3A).

In one or more embodiments, each of a successive number of multiple sensing passes can be used to determine the particular data states (e.g., L0 through L3) of a group of memory cells in association with a single sensing operation. The number of sensing passes associated with determining the data states of each cell of a group of cells in association with a voltage based sensing operation in accordance with one or more embodiments of the present disclosure can be one less than the number of data states to which the cells can be programmed. That is, if the cells are programmable to X data states, then the number of sensing passes associated with determining the data states of each of the cells can be X-1, in one or more embodiments. For instance, in the example illustrated in FIGS. 3A-3D, three sensing passes can be used to determine to which of four data states (e.g., L0, L1, L2, and L3) the cells are programmed. A first sensing pass can be used to determine those cells of the group programmed to state L3, a second sensing pass can be used to determine those cells of the group programmed to state L2, and a third sensing pass can be used to determine those cells of the group programmed to state L1. The remaining cells of the group (e.g., those not determined to be in state L3, L2, or L1) would be determined to be programmed to state L0. Accordingly, the multiple sensing passes associated with the sensing operation result in a determination of the states of each of the cells of the group.

FIG. 3B illustrates an example of a first sensing pass of multiple sensing passes associated with a voltage based sensing operation in accordance with one or more embodiments of the present disclosure. In this example, the first sensing pass is used to determine those cells (e.g., 315-0 through 315-5) programmed to state L3. As such, in the sensing pass illustrated in FIG. 3B, the first read voltage 325-1 (RV1) is applied to the selected word line 305. That is, the first read voltage RV1 of 0.12V is applied to word line 305. A reference voltage of 0V is applied to the bit lines 310-0 through 310-5 such that a potential difference (e.g., 0.12V) is created across each of the memory cells 315-0 through 315-5. The memory cells 315-0 through 315-5 may or may not conduct current responsive to the applied read voltage RV1, depending on the resistance levels of the respective cells 315-0 through 315-5.

In one or more embodiments, sensing circuitry 350 is configured to determine those cells 315-0 through 315-5 that conduct current responsive to a read voltage applied to the selected word line 305. The sensing circuitry 350 can be configured to determine if the cells 315-0 through 315-5 conduct at least a threshold amount of current responsive to an applied read voltage (e.g., RV1, RV2, RV3). The threshold amount of current can be about 100 nA; however, embodiments are not limited to a particular threshold amount of current (e.g., the threshold amount of current may be less than or greater than 100 nA).

In one or more embodiments, the sensing circuitry can provide an indication of those cells 315-0 through 315-5 that conduct at least the threshold amount of current responsive to one of the number of different read voltages (e.g., RV1, RV2, RV3) applied to the selected word line 305 in association with the number of multiple sensing passes. For instance, in the example illustrated in FIGS. 3B-3D, the sensing circuitry 350 includes a number of sense amplifiers 318-0, 318-1, 318-2, 318-3, 318-4, and 318-5 corresponding to the respective bit lines 310-0 through 310-5 and configured to trip (e.g., from logic 0 to logic 1) responsive to a sensed threshold current of 100 nA. The logic state of the sense amps 318-0 through 318-5 can be latched (e.g., via data latches not shown in FIGS. 3B-3D) to provide the indication of whether or not the cells 315-0 through 315-5 conduct at least the threshold amount of current (e.g., 100 nA) responsive to the applied first read voltage 325-1 in association with a first sensing pass (P1) illustrated in FIG. 3B. As such, the data latches corresponding to the sense amps 318-0 through 318-5 and associated with sensing circuitry 350 can latch a set of data values indicating those cells of the group whose corresponding bit line conducts at least the threshold amount of current responsive to the applied first sense voltage;

In the example shown in FIG. 3B, the sensing circuitry 350 determines that cells 315-2 and 315-5 conduct at least the threshold amount of current (e.g., 100 nA) responsive to the applied first read voltage 325-1 (e.g., 0.12V). That is, sense amp 318-2 trips responsive to current I2 down bit line 310-2 and sense amp 318-5 trips responsive to current I5 down bit line 310-5. The remaining sense amps (e.g., 318-0, 318-1, 318-3, and 318-4) do not trip responsive to the applied first read voltage 325-1. That is, the resistance level of the memory cells 315-0, 315-1, 315-3, and 315-4 is such that the potential difference (e.g., 0.12V) across the memory cells 315-0, 315-1, 315-3, and 315-4 in association with the first sensing pass is insufficient to provide the threshold amount of current on the corresponding bit lines 310-0, 310-1, 310-3, and 310-4. The latched data values associated with the cells 315-0 through 315-5 responsive to the first sensing pass (P1) are illustrated in FIG. 3B.

FIG. 3C illustrates a second sensing pass of multiple sensing passes associated with the voltage based sensing operation in accordance with one or more embodiments of the present disclosure. In this example, the second sensing pass is used to determine those cells (e.g., 315-0 through 315-5) programmed to state L2. As such, in the sensing pass illustrated in FIG. 3C, the second read voltage 325-2 (RV2) is applied to the selected word line 305. That is, the second read voltage RV2 of 0.22V is applied to word line 305. In one or more embodiments, a disabling voltage is applied to bit lines (e.g., 310-0 through 310-5) corresponding to those cells (e.g., 315-0 through 315-5) that conducted at least the threshold amount of current in association with a previous one of the multiple passes. As used herein, a disabling voltage refers to a voltage applied to a bit line in association with one or more sensing passes to inhibit the conduction of current on the bit line (e.g., such that a cell coupled to the bit line does not conduct the threshold amount of current regardless of the resistance level of the cell). Therefore, cells coupled to disabled bit lines (e.g., bit lines having the disabling voltage applied thereto) will not conduct current responsive to the applied read voltage.

As such, in the example illustrated in FIG. 3C, a disabling voltage 335 is applied to bit lines 310-2 and 310-5 (e.g., the bit lines corresponding to the cells that were determined to conduct at least the threshold amount of current in the previous sensing pass described in connection with FIG. 3B). In this example, the disabling voltage 335 is the same as the read voltage 325-2 (e.g., 0.22V) associated with the second sensing pass. However, embodiments are not so limited. For instance, the disabling voltage 335 may be various different voltages adequate to prevent conduction on the disabled bit lines 310-2 and 310-5 (e.g., a voltage greater than RV2 or a voltage less than RV2 but great enough to prevent the disabled bit lines from conducting the threshold amount of current responsive to RV2).

In this example, a reference voltage of 0V is applied to the non-disabled bit lines 310-0, 310-1, 310-3, 310-4 such that a potential difference equal to RV2 (e.g., 0.22V) is created across each of the memory cells 315-0, 315-1, 315-3, 315-4. The memory cells coupled to the non-disabled bit lines 310-0, 310-1, 310-3, 310-4 may or may not conduct current responsive to the applied read voltage RV2, depending on the resistance levels of the respective cells 315-0, 315-1, 315-3, 315-4.

As described above, the sensing circuitry 350 is configured to determine those cells 315-0 through 315-5 that conduct at least the threshold amount of current responsive to the applied read voltage (e.g., RV2 for the sensing pass of FIG. 3C). The logic state of the sense amps 318-0 through 318-5 is latched to provide the indication of whether or not the cells 315-0 through 315-5 conduct at least the threshold amount of current (e.g., 100 nA) responsive to the applied second read voltage 325-2 (RV2) in association with the second sensing pass (P2) illustrated in FIG. 3C. That is, data latches corresponding to the sense amps 318-0 through 318-5 can latch a set of data values indicating those cells of the group whose corresponding bit line conducts at least the threshold amount of current responsive to the applied second sense voltage. The sensing circuitry 350 can include a number of sets of data latches (e.g., a set for each of the number of multiple sensing passes) to provide a set of data values corresponding to each of the number of multiple sensing passes.

In the example shown in FIG. 3C, the sensing circuitry 350 determines that cell 315-1 conducts at least the threshold amount of current (e.g., 100 nA) responsive to the applied second read voltage 325-2 (e.g., 0.22V). That is, sense amp 318-1 trips responsive to current I1 down bit line 310-1. The remaining sense amps (e.g., 318-0, 318-2, 318-3, 318-4, and 318-5) do not trip responsive to the applied read voltage 325-2. That is, the resistance level of the memory cells 315-0, 315-3, and 315-4 is such that the potential difference (e.g., 0.22V) across the memory cells 315-0, 315-3, and 315-4 in association with the second sensing pass is insufficient to provide at least the threshold amount of current on the corresponding bit lines 310-0, 310-3, and 310-4. Also, the cells determined to have conducted the threshold amount of current responsive to the previous first sensing pass (e.g., cells 315-2 and 315-5) are coupled to disabled bit lines 310-2 and 310-5 such that they do not conduct at least the threshold amount of current during the subsequent sensing pass shown in FIG. 3C. The latched data values associated with the cells 315-0 through 315-5 responsive to the second sensing pass (P2) are illustrated in FIG. 3C.

FIG. 3D illustrates a third sensing pass of multiple sensing passes associated with the voltage based sensing operation in accordance with one or more embodiments of the present disclosure. In this example, the third sensing pass is used to determine those cells (e.g., 315-0 through 315-5) programmed to state L1. As such, in the sensing pass illustrated in FIG. 3D, the third read voltage 325-3 (RV3) is applied to the selected word line 305. That is, the third read voltage RV3 of 0.35V is applied to word line 305. Similar to the sensing pass described in connection with FIG. 3C, a disabling voltage 336 is applied to bit lines (e.g., 310-0 through 310-5) corresponding to those cells (e.g., 315-0 through 315-5) that conducted at least the threshold amount of current in association with a previous one of the multiple sensing passes.

In the example illustrated in FIG. 3D, the disabling voltage 336 is applied to bit lines 310-1, 310-2, and 310-5 (e.g., the bit lines corresponding to the cells that were determined to conduct at least the threshold amount of current in the previous sensing passes described in connection with FIGS. 3B and 3C). In one or more embodiments, the disabling voltage can be adjusted for each of the number of multiple sensing passes. For instance, in the example of FIG. 3D, the disabling voltage 336 (e.g., 0.35V) associated with the third sensing pass is greater than the disabling voltage 335 (e.g., 0.22V) associated with the second sensing pass shown in FIG. 3C.

Similar to the previous sensing passes, a reference voltage of 0V is applied to the non-disabled bit lines 310-0, 310-3, and 310-4 such that a potential difference equal to RV3 (e.g., 0.35V) is created across each of the memory cells 315-0, 315-3, and 315-4. The memory cells coupled to the non-disabled bit lines 310-0, 310-3, 310-4 may or may not conduct current responsive to the applied read voltage RV3, depending on the resistance levels of the respective cells 315-0, 315-3, 315-4.

The sensing circuitry 350 is configured to determine those cells 315-0 through 315-5 that conduct at least the threshold amount of current responsive to the applied read voltage (e.g., RV3 for the sensing pass of FIG. 3D). The logic state of the sense amps 318-0 through 318-5 is latched to provide the indication of whether or not the cells 315-0 through 315-5 conduct at least the threshold amount of current (e.g., 100 nA) responsive to the applied third read voltage 325-3 (RV3) in association with the third sensing pass (P3) illustrated in FIG. 3D. In this example, a set of data latches corresponding to the sense amps 318-0 through 318-5 latches a set of data values indicating those cells of the group whose corresponding bit line conducts at least the threshold amount of current responsive to the applied third read voltage RV3.

In the example shown in FIG. 3D, the sensing circuitry 350 determines that cells 315-0 and 315-3 conduct at least the threshold amount of current (e.g., 100 nA) responsive to the applied third read voltage 325-3 (e.g., 0.35V). That is, sense amp 318-0 trips responsive to current I0 down bit line 310-0 and sense amp 318-3 trips responsive to current I3 down bit line 310-3. The remaining sense amps (e.g., 318-1, 318-2, 318-4, and 318-5) do not trip responsive to the applied read voltage 325-3. That is, the resistance level of the memory cell 315-4 is such that the potential difference (e.g., 0.35V) across the memory cell 315-4 in association with the third sensing pass is insufficient to provide the threshold amount of current on the corresponding bit line 310-4. Also, the cells determined to have conducted at least the threshold amount of current responsive to one of the previous sensing passes (e.g., cells 315-1, 315-2, and 315-5) are coupled to disabled bit lines 310-1, 310-2, and 310-5 such that they do not conduct at least the threshold amount of current during the subsequent sensing pass shown in FIG. 3D. The latched data values associated with the cells 315-0 through 315-5 responsive to the third sensing pass (P3) are illustrated in FIG. 3D.

The latched sets of data values corresponding the first, second, and third sensing passes (P1, P2, and P3) of the multiple pass voltage based sensing operation described in connection with FIGS. 3A-3D can indicate the programmed data states for each of the cells 315-0 through 315-5. In one or more embodiments, and in the example illustrated in FIG. 3D, the three sets of latched data values corresponding to the successive first sensing pass (P1), second sensing pass (P2), and third sensing pass (P3) can provide a decoded value of the data state (e.g., L0, L1, L2, L3) of each of the cells (e.g., 315-0 through 315-5). For instance, in this example, "000" indicates state L0, "100" indicates state L1, "010" indicates state L2, and "001" indicates state L3. The decoded value of the data state can be a thermometer code among other decoded values.

As such, in the example illustrated in FIG. 3D, the three latched data values corresponding to cell 315-0 are "100" (e.g., a latched value of 1 corresponding to sensing pass P3, a latched value of 0 corresponding to sensing pass P2, and a latched value of 0 corresponding to sensing pass P1). Similarly, the three latched data values corresponding to cell 315-1 are "010" (L2), the three latched data values corresponding to cell 315-2 are "001" (L3), the three latched data values corresponding to cell 315-3 are "100" (L1), the three latched data values corresponding to cell 315-4 are "000" (L0), and the three latched data values corresponding to cell 315-5 are "001" (L3).

Embodiments of the present disclosure are not limited to the example illustrated in FIGS. 3A-3D. For instance, the sensing circuitry 350 may include fuse circuits instead of, or in addition to, the sense amps and/or data latches to indicate the sensed data states of the memory cells. Also, embodiments are not limited to use of a particular type of code (e.g., thermometer code) in association with sensed data states.

In one or more embodiments, one or more of the number of multiple sensing passes can be repeated in association with a sensing operation. For instance, one or more of the number of successive multiple passes may be repeated prior to performing a subsequent one of the number of sensing passes. As an example, the first sensing pass described in connection with FIG. 3B may be repeated prior to performing the second sensing pass described in connection with FIG. 3C. Since the voltage drop across a selected word line due to the cumulative current of conducting cells can reduce the amount of current conducted by other cells on the word line, repeating one or more of the sensing passes can improve the accuracy of a sensing operation, among other benefits. For instance, in some instances, the voltage drop on a selected word line during a sensing pass may be sufficient to affect whether or not a sense amp corresponding to a particular cell trips. As an example, the voltage drop on the selected word line during a particular pass may be significant enough such that a cell programmed to a particular state (e.g., L1) conducts less than the threshold amount of current (e.g., 90 nA as compared to 100 nA, for instance) during the sensing pass, such that the state of the cell is misread.

However, since the bit lines corresponding to those cells that do conduct at least the threshold amount of current during the sensing pass are subsequently disabled, the cells coupled to the disabled bit lines will not contribute to the voltage drop across the selected word line if the same sensing pass is repeated. In some instances, the amount of voltage drop reduction across the selected word line can be sufficient such that the cell that conducted a current amount less than the threshold amount of current (e.g., 90 nA) during the sensing pass does conduct at least the threshold amount of current (e.g., 100 nA) if the sensing pass is repeated. As such, repeating one or more of the multiple sensing passes can provide benefits such as providing a coarse/fine sensing scheme. For instance, cells having a lower resistance level may conduct at least the threshold amount of current during a particular sensing pass and cells corresponding to the same data state but having a higher resistance level may not conduct at least the threshold amount of current unless the particular sensing pass is repeated.

Although the embodiment illustrated in FIGS. 3A and 3B include sensing multi-level cells (MLCs), embodiments are not limited to MLCs or to a particular number of data states storable per cell. For instance, in one or more embodiments, the cells 315-0 through 315-5 can be single level cells (e.g., SLCs representing). In one or more embodiments, multiple sensing passes, as described above, can be performed on the cells. In some such embodiments, the same read voltage can be applied to the selected word line for each of the number of sensing passes. Disabling those bit lines corresponding to cells that conduct at least the threshold amount of current during a previous sensing pass can reduce the voltage drop on the word line during a subsequent sensing pass using the same read voltage.

Figure 4:
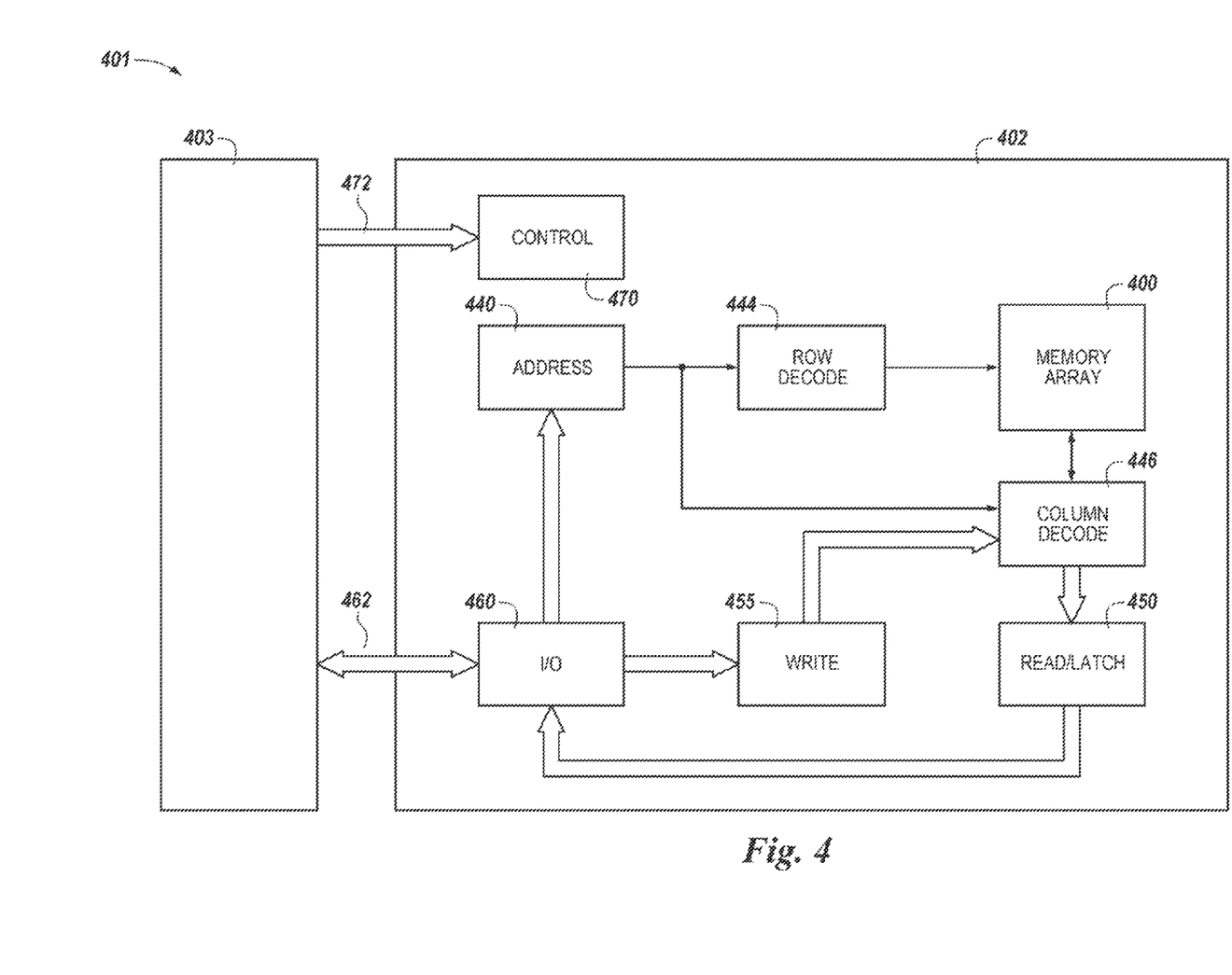
FIG. 4 is a functional block diagram of a computing system having at least one resistive memory device that can be operated in accordance with one or more embodiments of the present disclosure.

FIG. 4 is a functional block diagram of a computing system 401 (e.g., a memory system) having at least one memory device 402 that can be operated in accordance with one or more embodiments of the present disclosure. Computing system 401 includes a memory access device 403 (e.g., a processor, a memory controller, etc.) coupled to the memory device 402. According to one or more embodiments of the present disclosure, the memory device 402 is a non-volatile resistive memory device (e.g., an RRAM device).

The memory device 402 includes a memory array 400. The array 400 can be an array of resistive memory cells such as array 100 shown in FIG. 1. The memory device 402 and memory access device 403, can be implemented as separate integrated circuits, or the memory access device 403 and the memory device 402 can be incorporated into the same integrated circuit, chip, or package. The memory access device 403 can be a discrete device (e.g., microprocessor) or some other type of process circuitry implemented in firmware, such as an application-specific integrated circuit (ASIC), for example.

I/O connections 462 and control connections 472 provide a communication interface between the access device 403 and the memory device 402. The embodiment of FIG. 4 includes address circuitry 440 to latch address signals provided over the I/O connections 462 through I/O circuitry 460. Address signals are received and decoded by a row decoder 444 and a column decoder 446 to access the memory array 400.

The memory device 402 includes sensing circuitry 450 (e.g., sensing circuitry 350 shown in FIGS. 3B-3D) that can sense data stored in (e.g., programmed to) the memory array 400 in accordance with one or more embodiments described herein. The I/O circuitry 460 is included for bi-directional data communication over the I/O connections 462 with the memory access device 403. Program circuitry 455 is included to program (e.g., write) data to the memory array 400.

The memory device 402 includes controller 470 that can decode signals provided by control connections 472 from the memory access device 403. These signals can include chip signals, write enable signals, and address latch signals (among others) that are used to control the operations of the memory device 402 and memory array 400, including data sensing (e.g., reading) and data programming (e.g., writing), among other operations.

The controller 470 can be a state machine, a sequencer, or some other type of control circuitry, for example. It will be appreciated by those having ordinary skill in the art that additional circuitry and control signals can be provided, and that the memory device detail of FIG. 4 has been reduced for ease of illustration.

CONCLUSION

The present disclosure includes resistive memory sensing methods and devices. One such method includes performing a voltage based multiple pass sensing operation on a group of cells coupled to a selected conductive line of an array of resistive memory cells. The voltage based multiple pass sensing operation can include providing an indication of those cells of the group that conduct at least a threshold amount of current responsive to one of a number of different sense voltages successively applied to the selected conductive line during each of a corresponding number of the multiple passes, and for each successive pass of the multiple passes, disabling data lines corresponding to those cells determined to have conducted the threshold amount of current in association with a previous one of the multiple passes.

In the detailed description of the present disclosure, reference is made to the accompanying drawings that form a part hereof, and in which is shown by way of illustration how one or more embodiments of the present disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the extent of the present disclosure.

As used herein, the designators "N" and "M," particularly with respect to reference numerals in the drawings, indicate that a number of the particular feature so designated can be included with one or more embodiments of the present disclosure. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for resistive memory sensing, comprising:
applying a first sense voltage to a word line coupled to a group of resistive memory cells each programmed to one of a number of data states;
determining cells of the group that conduct at least a threshold amount of current responsive to the applied first sense voltage;
subsequently determining cells of the group that conduct at least the threshold amount of current responsive to a second sense voltage applied to the word line;
subsequently determining cells of the group that conduct at least the threshold amount of current responsive to a third sense voltage applied to the word line; and
determining, for each of the cells of the group, a respective one of the number of data states corresponding to the cell based on a particular one of the first, second, and third applied sense voltages for which the cell conducted at least the threshold amount of current;
wherein the first, second and third sense voltages are successively applied to the word line as part of a voltage based multiple pass sensing operation; and
wherein the threshold amount of current is fixed for determining cells of the group that conduct the at least the threshold amount of current responsive to the first sense voltage, the second sense voltage, and the third sense voltage applied to the word line.

2. The method of claim 1, including disabling the cells of the group that conduct at least the threshold amount of current responsive to the applied first sense voltage while the second sense voltage is applied to the word line.

3. The method of claim 2, wherein disabling the cells of the group that conduct at least the threshold amount of current responsive to the applied first sense voltage includes applying a first disabling voltage to data lines coupled to the cells of the group that conduct at least the threshold amount of current responsive to the applied first sense voltage.

4. The method of claim 3, wherein applying the first disabling voltage to the data lines coupled to the cells of the group that conduct at least the threshold amount of current responsive to the applied first sense voltage includes applying a first disabling voltage having a magnitude at least as great as the first sense voltage.

5. The method of claim 2, including disabling the cells of the group that conduct at least the threshold amount of current responsive to the applied second sense voltage while the third sense voltage is applied to the word line.

6. The method of claim 5, including disabling the cells of the group that conduct at least the threshold amount of current responsive to the applied first sense voltage while the third sense voltage is applied to the word line.

7. The method of claim 6, wherein:
disabling the cells of the group that conduct at least the threshold amount of current responsive to the applied first sense voltage includes applying a first disabling voltage to data lines coupled to the cells of the group that conduct at least the threshold amount of current responsive to the applied first sense voltage; and
disabling the cells of the group that conduct at least the threshold amount of current responsive to the applied second sense voltage while the third sense voltage is applied to the word line includes applying a second disabling voltage to data lines coupled to the cells of the group that conduct at least the threshold amount of current responsive to the applied second sense voltage.

8. A method of sensing resistive memory cells, the method comprising:
successively applying a number of different sense voltages to a word line coupled to a group of resistive memory cells, wherein the number of different sense voltages includes at least three different sense voltages; and
for each of the sense voltages, determining whether any of the cells of the group conduct at least a threshold amount of current responsive to the respective one of the sense voltages;
wherein at least two of the number of different sense voltages are successively applied to the word line as part of a voltage based multiple pass sensing operation; and
wherein the threshold amount of current is fixed for determining whether any of the cells of the group conduct at least the threshold amount of current responsive to the respective one of the sense voltages, and wherein a polarity of a potential difference across the group of resistive memory cells is the same during application of the at least three different sense voltages.

9. The method of claim 8, further comprising, for each of the sense voltages, applying a disabling voltage to those cells of the group determined to have conducted at least the threshold amount of current in association with a previously applied one of the sense voltages.

10. The method of claim 9, wherein successively applying a number of different sense voltages to the word line comprises successively applying the number of different sense voltages to the word line, and wherein applying a disabling voltage to those cells of the group determined to have conducted at least the threshold amount of current comprises applying a disabling voltage to a number of data lines, wherein each of the number of data lines is coupled to a respective one of the cells determined to have conducted at least the threshold amount of current in association with a previously applied one of the sense voltages.

11. The method of claim 9, further comprising, for each of the sense voltages, applying a reference voltage to cells of the group other than the cells of the group determined to have conducted at least the threshold amount of current in association with a previously applied one of the sense voltages.

12. The method of claim 9, further comprising adjusting the disabling voltage for each of the number of different sense voltages applied to the word line.

13. The method of claim 8, further comprising, for each of the sense voltages, providing a respective indication of those cells of the group determined to have conducted at least the threshold amount of current.

14. The method of claim 8, wherein successively applying a number of different sense voltages comprises:
applying a first sense voltage to the group of cells;
applying a second sense voltage to the group of cells; and
applying at least one of the first and the second sense voltages to group of cells more than once.

15. The method of claim 8, wherein successively applying a number of different sense voltages comprises:

applying a first sense voltage to the group of cells;
applying the first sense voltage to the group of cells again;
applying a second sense voltage to the group of cells;
applying the second sense voltage to the group of cells again;
applying a third sense voltage to the group of cells; and
applying the third sense voltage to the group of cells again.

16. A method for resistive memory sensing, comprising:
applying a first sense voltage to a word line coupled to a group of resistive memory cells each programmed to one of a number of data states;
determining cells of the group that conduct at least a threshold amount of current responsive to the applied first sense voltage;
subsequently determining cells of the group that conduct at least the threshold amount of current responsive to a second sense voltage applied to the word line;
subsequently determining cells of the group that conduct at least the threshold amount of current responsive to a third sense voltage applied to the word line;
wherein at least one of the first sense voltage, the second sense voltage, and the third sense voltage are applied to the word line in multiple sensing passes as part of a voltage based multiple pass sensing operation;
determining, for each of the cells of the group, a respective one of the number of data states corresponding to the cell based on a particular one of the first, the second, and the third applied sense voltages for which the cell conducted at least the threshold amount of current; and
wherein a polarity of a potential difference across the group of resistive memory cells is the same during application of the first sense voltage, the second sense voltage, and the third sense voltage to the word line.

17. A resistive memory device comprising:
a group of resistive memory cells coupled to a word line; and
a controller configured to control:
the successive application of a number of different sense voltages to the word line, wherein the number of different sense voltages includes at least three different sense voltages; and
for each of the sense voltages, the determination of whether any of the cells of the group conduct at least a threshold amount of current responsive to the respective one of the sense voltages; and
wherein at least two of the number of different sense voltages are successively applied to the word line as part of a voltage based multiple pass sensing operation; and
wherein the threshold amount of current is fixed for determining whether any of the cells of the group conduct at least a threshold amount of current responsive to the respective one of the sense voltages, and wherein a polarity of a potential difference across the group of resistive memory cells is the same during application of the at least three different sense voltages.

18. The method of claim 17, wherein the determination of whether any of the cells of the group conduct at least a threshold amount of current responsive to the respective one of the sense voltages is based on current sensed on data lines to which the group of cells are coupled.

* * * * *